United States Patent
Yano et al.

(10) Patent No.: US 9,212,085 B2
(45) Date of Patent: Dec. 15, 2015

(54) GLASS-CERAMICS COMPOSITE MATERIAL

(71) Applicant: NGK Insulators, Ltd., Nagoya-Shi (JP)

(72) Inventors: Shinsuke Yano, Nagoya (JP); Yoshihiro Tanaka, Nagoya (JP); Tsutomu Nanataki, Toyoake (JP); Hirofumi Yamaguchi, Komaki (JP); Natsumi Shimogawa, Nagoya (JP); Naoto Ohira, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/221,717

(22) Filed: Mar. 21, 2014

(65) Prior Publication Data

US 2014/0206522 A1    Jul. 24, 2014

Related U.S. Application Data

(63) Continuation of application No. PCT/JP2013/058824, filed on Mar. 26, 2013.

(30) Foreign Application Priority Data

Sep. 10, 2012 (JP) .................................. 2012-198985

(51) Int. Cl.
| | |
|---|---|
| C03C 14/00 | (2006.01) |
| C03C 10/00 | (2006.01) |
| C03C 3/064 | (2006.01) |
| C03C 3/066 | (2006.01) |
| C03C 3/091 | (2006.01) |
| C03C 3/093 | (2006.01) |
| C04B 35/18 | (2006.01) |
| C04B 35/565 | (2006.01) |
| C04B 35/581 | (2006.01) |
| C04B 35/584 | (2006.01) |
| H05K 1/03 | (2006.01) |

(52) U.S. Cl.
CPC ............. *C03C 10/0045* (2013.01); *C03C 3/064* (2013.01); *C03C 3/066* (2013.01); *C03C 3/091* (2013.01); *C03C 3/093* (2013.01); *C03C 14/00* (2013.01); *C04B 35/18* (2013.01); *C04B 35/565* (2013.01); *C04B 35/581* (2013.01); *C04B 35/584* (2013.01); *H05K 1/03* (2013.01); *H05K 1/0306* (2013.01); *C04B 2235/36* (2013.01); *C04B 2235/365* (2013.01); *C04B 2235/656* (2013.01); *C04B 2235/6586* (2013.01); *C04B 2235/80* (2013.01); *C04B 2235/96* (2013.01); *H05K 2201/0209* (2013.01)

(58) Field of Classification Search
CPC ..................................................... C03C 14/004
USPC ............................................................ 501/32
See application file for complete search history.

(56) References Cited

U.S. PATENT DOCUMENTS

| | | | |
|---|---|---|---|
| 5,214,005 A | 5/1993 | Yamakawa et al. | |
| 6,579,818 B2 * | 6/2003 | Kawai et al. | 501/32 |
| 6,630,417 B2 * | 10/2003 | Kawai et al. | 501/16 |
| 7,906,444 B2 * | 3/2011 | Liebald et al. | 501/9 |
| 2002/0039645 A1 | 4/2002 | Kawai et al. | |
| 2006/0128546 A1 * | 6/2006 | Schluckwerder et al. | 501/7 |
| 2014/0296053 A1 * | 10/2014 | Yano et al. | 501/5 |

FOREIGN PATENT DOCUMENTS

| | | | |
|---|---|---|---|
| JP | 63-210043 | A1 | 8/1988 |
| JP | 02-221162 | A1 | 9/1990 |
| JP | 02225339 | * | 9/1990 |
| JP | 04-254477 | A1 | 9/1992 |
| JP | 06-016477 | A1 | 1/1994 |
| JP | 2001-342063 | A1 | 12/2001 |
| JP | 2002-053369 | A1 | 2/2002 |
| JP | 2002-348172 | A1 | 12/2002 |
| JP | 2003-073162 | A1 | 3/2003 |
| JP | 2003-095746 | A1 | 4/2003 |
| JP | 2003-137657 | A1 | 5/2003 |
| JP | 2005-533744 | A1 | 11/2005 |
| JP | 2008-270741 | A1 | 11/2008 |

OTHER PUBLICATIONS

International Search Report and Written Opinion dated Jul. 2, 2013.

* cited by examiner

*Primary Examiner* — Karl Group
(74) *Attorney, Agent, or Firm* — Burr & Brown, PLLC

(57) ABSTRACT

An easily-administered technology which demonstrates the intrinsic thermal conductivity improvement effect by addition of non-oxide system compound crystal phase (filler particles) and makes it possible to sufficiently raise the thermal conductivity of a glass-ceramics composite material is provided. In the glass phase which constitutes a glass-ceramics composite material, the quantity of aluminum oxide ($Al_2O_3$) component is increased under a condition where at least either of zinc oxide (ZnO) component or magnesium oxide (MgO) component exists in a predetermined quantity or more. Thereby, the unintended reaction between a non-oxide system compound crystal phase and a glass phase can be suppressed, and the intrinsic thermal conductivity improvement effect by addition of non-oxide system compound crystal phase (filler particles) can be demonstrated.

12 Claims, No Drawings

GLASS-CERAMICS COMPOSITE MATERIAL

BACKGROUND OF THE INVENTION

1. Field of the Invention

The present invention relates to a glass-ceramics composite material. In detail, the present invention relates to a glass-ceramics composite material which has high thermal conductivity and is suitable for a low-temperature simultaneous firing use.

2. Description of Related Art

For example, in a wiring board applied to a semiconductor package, a multi-layer wiring board, etc., suppression of the loss by reduction of the electrical resistance of the conductor which constitutes wiring and improvement of the heat-resistance corresponding to the heat generated from a semiconductor element has been an important subject. As measures over the former, for example, low resistance metal (good conductor), such as gold, silver, copper, and an alloy containing such metal, is widely used as a conductor. On the other hand, as measures over the latter, a ceramic board which uses ceramics as a base is widely used in place of a resin board which uses resin as a base.

In such a ceramic board, as mentioned above, the conductor which constitutes a surface electrode and inner layer wiring comprises low resistance metal (good conductor), such as gold, silver, copper, and an alloy containing such metal, for example. Thereby, in such a ceramic board, For example, even in a case where highly fine-lined inner layer wiring is disposed for the purpose of improving the performance of a semiconductor package, etc., increase of the electrical resistance of the wiring can be suppressed and the resistance loss in the semiconductor package which uses the ceramic board can be reduced.

By the way, low resistance metal (good conductor), such as gold, silver, copper, and an alloy containing such metal, used for the purpose of suppressing increase of the electrical resistance of the wiring as mentioned above has a relatively low melting point as compared with other metal. When the sheet of dielectric material (base which consists of a dielectric layer) in which conductor pattern (wiring) comprising the metal having such a low melting point is embedded is simultaneously fired at the temperature more than the melting point of the metal, there is a possibility that the metal may melt and it may become difficult to maintain desired shape of the conductor pattern. Therefore, when using such a low resistance conductor as a conductor which constitutes a surface electrode and inner layer wiring, it is desirable to use the ceramics which can be fired at the temperature of less than the melting point of the low resistance conductor used.

In addition, as ceramics which can be fired at the temperature of less than the melting point of the low resistance conductor used as mentioned above, it is desirable to use what is called low-temperature firing board material (LTCC: Low Temperature Co-fired Ceramics). Even when low resistance metal (good conductor), such as gold, silver, copper, and an alloy containing such metal, which has a relatively low melting point as mentioned above, is used, a possibility that the metal may melt and it may become difficult to maintain the desired shape of the conductor pattern can be reduced.

By the way, for example, power semiconductor elements using, as a loss remedy, silicon carbide (SiC) wafers and/or gallium nitride (GaN) wafers which are being used widely in place of silicon (Si) wafers used conventionally have a feature that an operation at a higher temperature is possible, as compared with the power semiconductor element using the conventional Si wafer. Thereby, the cooling mechanism indispensable in the power semiconductor element using the conventional Si wafer (for example, a heat sink, a water-cooled mechanism, etc.) can be simplified drastically. As a result, reduction in size and weight of the power module can also be attained by using these new types of wafer.

However, the temperature in the surroundings of the power semiconductor element is becoming higher than before due to the rise of the operating temperature and reduction in size and weight of a power module as well as the simplification of a cooling mechanism accompanying use of the new types of wafer as mentioned above. Therefore, the demand for a ceramic board that has not only heat resistance higher than before, but also higher thermal conductivity, is increasing even more since the temperature of the surroundings of the power semiconductor element is becoming higher than before.

In the art, in response to such a demand, for example, it has been proposed to add particles having high thermal conductivity, such as aluminum nitride (AlN) particles and silicon carbide (SiC) particles, etc. (high thermal conductivity particles) as filler particles to the glass-ceramics composite material that constitutes the base of the ceramic board, which has an inner layer wiring consisting of low resistance metal (good conductor), such as gold, silver, copper, and an alloy containing such metal, for example (for example, refer to Patent Literatures 1 to 8).

Moreover, it has been proposed to blend a spinel system compound crystal phase such as gahnite ($ZnAl_2O_4$) and/or spinel ($MgAl_2O_4$), as well as at least one kind of non-oxide system compound crystal phase chosen from the group of aluminum nitride (AlN), silicon nitride ($Si_3N_4$), silicon carbide (SiC), and boron nitride (BN), into a glass phase comprising as a main component silicon oxide ($SiO_2$), aluminum oxide ($Al_2O_3$), zinc oxide (ZnO), magnesium oxide (MgO), and boron oxide ($B_2O_3$), for the purpose of effectively raising the strength and thermal conductivity of a base (for example, refer to Patent Literature 9).

As mentioned above, in the art, various technology for raising the thermal conductivity of a glass-ceramics composite material have been proposed, for example, by adding a non-oxide system compound crystal phase, such as aluminum nitride (AlN), to a glass-ceramics composite material, as filler particles. Nevertheless, it is a fact that a glass-ceramics composite material having sufficient thermal conductivity has not yet been put into practical use by such conventional technologies.

As a cause inhibiting practical realization of the glass-ceramics composite material which has sufficient thermal conductivity, for example, the reaction between a non-oxide system compound crystal phase (filler particles), such as aluminum nitride (AlN), and a glass phase can be exemplified. When the reaction occurs, the non-oxide system compound crystal phase (filler particles) which has very high thermal conductivity (about 170 to 200 W/m·° C.) is consumed, and a spinel system compound crystal phase which has low thermal conductivity generates (specifically, about 20 to 25 W/m·° C. in the case of a spinel system compound crystal phase, and about 2 to 5 W/m·° C. in the case of silicate system oxides, such as mullite, cordierite, and magnesium silicate) generates. As a result, even when a non-oxide system compound crystal phase (filler particles) which has very high thermal conductivity is added, the effect on sufficiently raising the thermal conductivity of a glass-ceramics composite material is suppressed by the reaction.

Then, in the art, it has been proposed to suppress the reaction between a non-oxide system compound crystal phase (filler particles) and a glass phase by blending a specific rare earth component as an indispensable component into a glass phase (refer to Patent Literature 10). However, the producing district of rare earth is limited and there is uneasiness in the stability of supply and a price.

Therefore, in the art, there has been a demand for an easily-administered technology which demonstrates the intrinsic thermal conductivity improvement effect by addition of non-oxide system compound crystal phase (filler particles) and makes it possible to sufficiently raise the thermal conductivity of a glass-ceramics composite material.

CITATION LIST

Patent Literature

[PTL 1] Japanese Patent Application Laid-Open (kokai) No. H02-221162
[PTL 2] Japanese Patent Application Laid-Open (kokai) No. H04-254477
[PTL 3] Japanese Patent Application Laid-Open (kokai) No. H06-016477
[PTL 4] Japanese Patent Application Laid-Open (kokai) No. 2001-342063
[PTL 5] Japanese Patent Application Laid-Open (kokai) No. 2002-348172
[PTL 6] Japanese Patent Application Laid-Open (kokai) No. 2003-073162
[PTL 7] Japanese Patent Application Laid-Open (kokai) No. 2003-137657
[PTL 7] Japanese Patent Application Laid-Open (translation of PCT application) No. 2005-533744
[PTL 9] Japanese Patent Application Laid-Open (kokai) No. 2002-053369
[PTL 10] Japanese Patent Application Laid-Open (kokai) No. 2003-095746

SUMMARY OF THE INVENTION

Technical Problem

As mentioned above, in the art, there has been a demand for an easily-administered technology which demonstrates the intrinsic thermal conductivity improvement effect by addition of non-oxide system compound crystal phase (filler particles) and makes it possible to sufficiently raise the thermal conductivity of a glass-ceramics composite material.

The present invention has been conceived in order to meet such a demand. More specifically, one objective of the present invention is to demonstrate the intrinsic thermal conductivity improvement effect by addition of non-oxide system compound crystal phase (filler particles) and make it possible to sufficiently raise the thermal conductivity of a glass-ceramics composite material.

DETAILED DESCRIPTION OF THE INVENTION

The above-mentioned one objective of the present invention can be attained by,
a glass-ceramics composite material obtained by firing:
a glass phase which comprises aluminum oxide ($Al_2O_3$), at least either of magnesium oxide (MgO) or zinc oxide (ZnO), silicon oxide ($SiO_2$), and boron oxide ($B_2O_3$) as main components, and
at least one kind of non-oxide system compound crystal phase chosen from the group of aluminum nitride (AlN), silicon carbide (SiC), and silicon nitride ($Si_3N_4$),
wherein;
based on the total amount of said glass phase,
the composition rate of aluminum oxide ($Al_2O_3$) is not less than 12 mass and is 40 mass % or less,
the composition rate of magnesium oxide (MgO) is not less than 12 mass % or the composition rate of zinc oxide (ZnO) is not less than 8 mass %, and both of the composition rates of magnesium oxide (MgO) and zinc oxide (ZnO) are 40 mass % or less, and
the composition rate of silicon oxide ($SiO_2$) is not less than 15 mass % and is 60 mass % or less, and
based on the amount of sum total of said glass phase and said non-oxide system compound crystal phase,
the composition rate of said non-oxide system compound crystal phase is not less than 20 mass % and is 60 mass % or less.

Advantageous Effects of Invention

In accordance with the glass-ceramics composite material according to the present invention, without the need for any special material etc., intrinsic thermal conductivity improvement effect by addition of non-oxide system compound crystal phase (filler particles) can be demonstrated, and it can make it possible to sufficiently raise the thermal conductivity of the glass-ceramics composite material.

DESCRIPTION OF EMBODIMENTS

As mentioned above, one objective of the present invention is to demonstrate the intrinsic thermal conductivity improvement effect by addition of non-oxide system compound crystal phase (filler particles) and make it possible to sufficiently raise the thermal conductivity of a glass-ceramics composite material, without the need for any special material etc.

As a result of wholehearted research in order to attain the objective, the present inventor has found that the unintended reaction between a non-oxide system compound crystal phase and a glass phase can be suppressed by increasing the quantity of aluminum oxide ($Al_2O_3$) component, under a condition where at least either of zinc oxide (ZnO) component or magnesium oxide (MgO) component exists in a predetermined quantity or more, in the glass phase which constitutes a glass-ceramics composite material, and has conceived the present invention.

Namely, the first embodiment of the present invention is,
a glass-ceramics composite material obtained by firing:
a glass phase which comprises aluminum oxide ($Al_2O_3$), at least either of magnesium oxide (MgO) or zinc oxide (ZnO), silicon oxide ($SiO_2$), and boron oxide ($B_2O_3$) as main components, and
at least one kind of non-oxide system compound crystal phase chosen from the group of aluminum nitride (AlN), silicon carbide (SiC), and silicon nitride ($Si_3N_4$),
wherein;
based on the total amount of said glass phase,
the composition rate of aluminum oxide ($Al_2O_3$) is not less than 12 mass % and is 40 mass % or less,
the composition rate of magnesium oxide (MgO) is not less than 12 mass % or the composition rate of zinc oxide (ZnO) is not less than 8 mass %, and both of the composition rates of magnesium oxide (MgO) and zinc oxide (ZnO) are 40 mass ° A) or less, and
the composition rate of silicon oxide ($SiO_2$) is not less than 15 mass % and is 60 mass % or less, and
based on the amount of sum total of said glass phase and said non-oxide system compound crystal phase, the composition rate of said non-oxide system compound crystal phase is not less than 20 mass % and is 60 mass % or less.

As mentioned above, the glass-ceramics composite material according to the present embodiment is, a glass-ceramics composite material obtained by firing:

a glass phase which comprises aluminum oxide ($Al_2O_3$), at least either of magnesium oxide (MgO) or zinc oxide (ZnO), silicon oxide ($SiO_2$), and boron oxide ($B_2O_3$) as main components, and at least one kind of non-oxide system compound crystal phase chosen from the group of aluminum nitride (AlN), silicon carbide (SiC), and silicon nitride ($Si_3N_4$).

In the main components which constitute the glass phase, as for magnesium oxide (MgO) and zinc oxide (ZnO), only one of them may be contained, or both of them may be contained. Moreover, the glass phase may contain some accessory components besides the above-mentioned main components, unless it becomes the hindrance of achievement of the objective of the present invention. For example, boron oxide ($B_2O_3$) included in the above-mentioned main components is a "flux component" added in order to adjust the melting behavior at the time of making glass raw materials melt at high temperature in the process during which a glass (phase) is generated. In such a flux component, alkali metal oxides (for example, lithium oxide ($Li_2O$), sodium oxide ($Na_2O$), potassium oxide ($K_2O$), etc.) may be contained besides boron oxide ($B_2O_3$). Moreover, the glass phase may contain a crystal nucleating agent (for example, zirconium oxide ($ZrO_2$), titanium oxide ($TiO_2$), platinum (Pt), and phosphorus pentoxide ($P_2O_5$) etc.) etc. which is added in order to promote crystallization of a glass phase, as an accessory component.

The glass phase can be obtained, for example, by melting various glass raw materials as mentioned above at a very high temperature (for example, 1200° C. or more) and throwing the resulting molten object into water to rapidly cool it, etc. On the other hand, for example, the above-mentioned non-oxide system compound crystal phase can be chosen from what is known in the art as filler particles added for the purpose of improvement in thermal conductivity, in the glass-ceramics composite material according to the above-mentioned conventional technology.

Subsequently, the glass-ceramics composite material can be obtained, for example, by mixing the glass phase obtained as mentioned above and the non-oxide system compound crystal phase at a desired composition rate in a powdered state, for example, and firing the mixture at a predetermined temperature (for example, 700° C. to 1050° C.). In addition, although the firing processing is generally performed in an atmosphere in which inactive gas exists (for example, nitrogen atmosphere, etc.), for example, from a viewpoint of the prevention from deterioration of filler particles, the firing processing may be performed in an atmosphere in which oxygen exists (oxidative atmosphere) when an oxide film suitable as an oxidation resistant film is easily formed on the surface of filler particles.

By the way, in the glass-ceramics composite material according to the conventional technology which is acquired by firing the glass phase containing the components as mentioned above and the non-oxide system compound crystal phase, in some cases, the non-oxide system compound crystal phase (filler particles) which intrinsically has very high thermal conductivity may be consumed by the reaction with the glass phase during the firing, and the thermal conductivity improvement effect by addition of non-oxide system compound crystal phase (filler particles) may not be sufficiently demonstrated, as mentioned above.

However, as mentioned above, the present inventor has found that the reaction between a non-oxide system compound crystal phase and a glass phase can be suppressed by increasing the quantity of aluminum oxide ($Al_2O_3$) component, under a condition where at least either of zinc oxide (ZnO) component or magnesium oxide (MgO) component exists in a predetermined quantity or more, in the glass phase which constitutes a glass-ceramics composite material.

Specifically, in the glass phase which constitutes the glass-ceramics composite material according to the present embodiment, various raw material components are blended so that:

based on the total amount of said glass phase, the composition rate of aluminum oxide ($Al_2O_3$) is not less than 12 mass % and is 40 mass % or less, the composition rate of magnesium oxide (MgO) is not less than 12 mass % or the composition rate of zinc oxide (ZnO) is not less than 8 mass %, and both of the composition rates of magnesium oxide (MgO) and zinc oxide (ZnO) are 40 mass % or less, and the composition rate of silicon oxide ($SiO_2$) is not less than 15 mass % and is 60 mass % or less.

In addition, when the composition rate of aluminum oxide ($Al_2O_3$) is less than 12 mass % based on the total amount of the glass phase, it is not desirable since the unintended reaction between the non-oxide system compound crystal phase (filler particles) and the glass phase as mentioned above cannot be effectively suppressed and, as a result, the possibility that the thermal conductivity improvement effect by addition of non-oxide system compound crystal phase (filler particles) may not fully be demonstrated increases. On the contrary, when the composition rate of aluminum oxide ($Al_2O_3$) exceeds 40 mass % based on the total amount of the glass phase, it is not desirable since vitrification becomes difficult, phase-separation of glass and/or a crystal component other than the glass phase increase, and it becomes impossible to sufficiently densify the mixture of the non-oxide system compound crystal phase (filler particles) and the glass phase by firing. In addition, in the present specification, "densification" means that water absorption rate becomes small. In addition, when the water absorption rate is high, the reliability of the glass ceramic composite material will decrease.

Moreover, as for magnesium oxide (MgO) and zinc oxide (ZnO), as mentioned above, what is necessary is that at least either of these components is blended as a constituent component of a glass phase at predetermined composition rates predetermined for each of them. Specifically, as for magnesium oxide (MgO) and zinc oxide (ZnO), both of the condition that the composition rate of magnesium oxide (MgO) is not less than 12 mass % or the composition rate of zinc oxide (ZnO) is not less than 8 mass % and the condition that both of the composition rates of magnesium oxide (MgO) and zinc oxide (ZnO) are 40 mass % or less must be met. As a matter of course, both magnesium oxide (MgO) and zinc oxide (ZnO) may be blended as constituent components of a glass phase, the composition rate of magnesium oxide (MgO) may be not less than 12 mass % and 40 mass % or less and, in addition, the composition rate of zinc oxide (ZnO) may be not less than 8 mass % and 40 mass % or less.

When the composition rate of magnesium oxide (MgO) is less than 12 mass % based on the total amount of the glass phase and the composition rate of zinc oxide (ZnO) is less than 8 mass % based on the total amount of the glass phase, it is not desirable since a possibility that the thermal conductivity as the whole glass-ceramics composite material generated as a result cannot be sufficiently raised increases. It is presumed that this is because sufficient quantity of a spinel system compound crystal phase (specifically, gahnite ($ZnAl_2O_4$) and/or spinel ($MgAl_2O_4$)) which has high thermal conductivity as compared with the glass phase cannot be precipitated when it is not the case that at least either of magnesium oxide (MgO) or zinc oxide (ZnO) exists in the predetermined amount or more.

On the other hand, when the composition rate of either one of magnesium oxide (MgO) or zinc oxide (ZnO) exceeds 40 mass % based on the total amount of the glass phase, it is not desirable since vitrification becomes difficult, phase-separation of glass and/or a crystal component other than the glass phase increase, and it becomes impossible to sufficiently densify the mixture of the non-oxide system compound crystal phase (filler particles) and the glass phase by firing.

Further, as for silicon oxide ($SiO_2$), in both a case where its composition rate is less than 15 mass % and a case where it exceeds 60 mass %, it is not desirable since vitrification becomes difficult, phase-separation of glass and/or a crystal component other than the glass phase increase, and it becomes impossible to sufficiently densify the mixture of the non-oxide system compound crystal phase (filler particles) and the glass phase by firing.

In addition, as mentioned above, a flux component added in order to adjust the melting behavior at the time of making glass raw materials melt at high temperature in the process during which a glass (phase) is generated may contain alkali metal oxides (for example, lithium oxide ($Li_2O$), sodium oxide ($Na_2O$), potassium oxide ($K_2O$), etc.). It is desirable that the composition rate of such a flux component is not less than 5 mass % and 35 mass % or less based on the total amount of the glass phase. When the composition rate of a flux component is less than 5 mass % based on the total amount of a glass phase, it is not desirable since vitrification becomes difficult, phase-separation of glass and/or a crystal component other than the glass phase increase, and it becomes impossible to sufficiently densify the mixture of the non-oxide system compound crystal phase (filler particles) and the glass phase by firing. On the contrary, when the composition rate of a flux component exceeds 35 mass % based on the total amount of the glass phase, it is not desirable since it will become more likely to react with moisture in the air and the reliability will decrease.

By the way, when the composition rate of the non-oxide system compound crystal phase (filler particles) is less than 20 mass % based on the amount of sum total of the glass phase and the non-oxide system compound crystal phase, it is not desirable since the possibility that the thermal conductivity improvement effect by addition of non-oxide system compound crystal phase (filler particles) is not fully be demonstrated. On the contrary, when the composition rate of the non-oxide system compound crystal phase (filler particles) exceeds 60 mass % based on the amount of sum total of the glass phase and the non-oxide system compound crystal phase, it is not desirable since it becomes impossible to sufficiently densify the mixture of the non-oxide system compound crystal phase (filler particles) and the glass phase by firing.

As mentioned above, in the glass-ceramics composite material according to the present embodiment, the composition rates of the various components which constitute the glass phase and the non-oxide system compound crystal phase (filler particles) meets the predetermined conditions and thereby it is possible to demonstrate the intrinsic thermal conductivity improvement effect by addition of non-oxide system compound crystal phase (filler particles) and to sufficiently raise the thermal conductivity of the glass-ceramics composite material, without the need for any special material (such as a rare earth component, etc.) etc.

By the way, as mentioned above, in the glass-ceramics composite material according to the present embodiment, it is desirable that the composition rate of aluminum oxide ($Al_2O_3$) is not less than 12 mass % and 40 mass % or less based on the total amount of the glass phase. However, preferably, it is desirable that the composition rate of aluminum oxide ($Al_2O_3$) is not less than 16 mass % based on the total amount of the glass phase and, more preferably, it is desirable that it is not less than 20 mass %.

Therefore, the second embodiment of the present invention is, the glass-ceramics composite material according to said first embodiment of the present invention, wherein:

the composition rate of aluminum oxide ($Al_2O_3$) based on the total amount of said glass phase is not less than 16 mass % and 40 mass % or less.

Moreover, the third embodiment of the present invention is, the glass-ceramics composite material according to said second embodiment of the present invention, wherein:

the composition rate of aluminum oxide ($Al_2O_3$) based on the total amount of said glass phase is not less than 20 mass % and 40 mass % or less.

As mentioned above, in the glass-ceramics composite materials according to these embodiments, the composition rate of aluminum oxide ($Al_2O_3$) is specified in the preferable range and the more preferable range, respectively. Therefore, in the glass-ceramics composite materials according to these embodiments, the above-mentioned objective of the present invention can be attained more effectively.

Moreover, as mentioned above, in the glass-ceramics composite material according to the present invention, it is desirable that the composition rate of magnesium oxide (MgO) is not less than 12 mass % and 40 mass % or less based on the total amount of the glass phase. However, preferably, it is desirable that the composition rate of magnesium oxide (MgO) is not less than 13 mass % based on the total amount of the glass phase and, more preferably, it is desirable that it is not less than 15 mass %.

Therefore, the fourth embodiment of the present invention is, the glass-ceramics composite material according to said first embodiment of the present invention, wherein:

the composition rate of magnesium oxide (MgO) based on the total amount of said glass phase is not less than 13 mass % and 40 mass % or less.

Moreover, the fifth embodiment of the present invention is, the glass-ceramics composite material according to said fourth embodiment of the present invention, wherein:

the composition rate of magnesium oxide (MgO) based on the total amount of said glass phase is not less than 15 mass % and 40 mass % or less.

As mentioned above, in the glass-ceramics composite materials according to these embodiments, the composition rate of magnesium oxide (MgO) is specified in the preferable range and the more preferable range, respectively. Therefore, in the glass-ceramics composite materials according to these embodiments, the above-mentioned objective of the present invention can be attained more effectively.

Further, as mentioned above, in the glass-ceramics composite material according to the present invention, it is desirable that the composition rate of zinc oxide (ZnO) is not less than 8 mass % and 40 mass % or less based on the total amount of the glass phase. However, preferably, it is desirable that the composition rate of zinc oxide (ZnO) is not less than 9 mass % based on the total amount of the glass phase and, more preferably, it is desirable that it is not less than 15 mass %.

Therefore, the sixth embodiment of the present invention is, the glass-ceramics composite material according to said first embodiment of the present invention, wherein:

the composition rate of zinc oxide (ZnO) based on the total amount of said glass phase is not less than 9 mass % and 40 mass % or less.

Moreover, the seventh embodiment of the present invention is, the glass-ceramics composite material according to said sixth embodiment of the present invention, wherein:

the composition rate of the zinc oxide (ZnO) based on the total amount of said glass phase is not less than 15 mass % and 40 mass % or less.

As mentioned above, in the glass-ceramics composite materials according to these embodiments, the composition rate of zinc oxide (ZnO) is specified in the preferable range and the more preferable range, respectively. Therefore, in the glass-ceramics composite materials according to these embodiments, the above-mentioned objective of the present invention can be attained more effectively.

Furthermore, as mentioned above, in the glass-ceramics composite material according to the present invention, it is desirable that the composition rate of silicon oxide ($SiO_2$) is not less than 15 mass % and 60 mass % or less based on the total amount of the glass phase. However, preferably, it is desirable that the composition rate of silicon oxide ($SiO_2$) is not less than 20 mass % based on the total amount of the glass phase.

Therefore, the eighth embodiment of the present invention is, the glass-ceramics composite material according to said first embodiment of the present invention, wherein:

the composition rate of silicon oxide ($SiO_2$) based on the total amount of said glass phase is not less than 20 mass % and 60 mass % or less.

As mentioned above, in the glass-ceramics composite materials according to these embodiments, the composition rate of silicon oxide ($SiO_2$) is specified in the preferable range and the more preferable range, respectively. Therefore, in the glass-ceramics composite materials according to these embodiments, the above-mentioned objective of the present invention can be attained more effectively.

By the way, in the above-mentioned explanation about the glass-ceramics composite materials according to some embodiments of the present invention, it was described that it is desirable that the composition rate of a flux component comprising, for example, at least one sort of substances chosen from boron oxide ($B_2O_3$) and alkali metal oxides (for example, lithium oxide ($Li_2O$), sodium oxide ($Na_2O$), potassium oxide ($K_2O$), etc.) is not less than 5 mass % and 35 mass % or less based on the total amount of the glass phase when the glass phase and non-oxide system compound crystal phase are mixed at a desired composition rate, for example, in a powdery state and the mixture is fired at a general temperature as firing temperature of such a composite material (for example, 700° C. to 1050° C.).

Specifically, in the past explanation, it was described that it is desirable that when the composition rate of a flux component is less than the 5 mass %, it is not desirable since vitrification becomes difficult, phase-separation of glass and/or a crystal component other than the glass phase increase, and it becomes impossible to sufficiently densify the mixture of the non-oxide system compound crystal phase (filler particles) and the glass phase by firing, while, on the contrary, when the composition rate of a flux component exceeds 35 mass % based on the total amount of the glass phase, it is not desirable since it will become more likely to react with moisture in the air and the reliability will decrease.

However, the present inventor continued research in order to further lower the lower limit of such a flux composition rate (composition rate of a flux component), for example, by further optimizing the mixing method of glass raw materials and melting conditions, etc. Moreover, the present inventor continued further research on the properties (especially, thermal conductivity) of the glass-ceramics composite material according to the present invention thus obtained by firing the mixture of the glass phase containing a flux component at a lower composition rate and the non-oxide system compound crystal phase.

As the result of the researches, the present inventors have found that, for example, by further optimizing the mixing method of glass raw materials and a melting condition, etc. to vitrify the materials in a state where the composition rate of the flux component based on the total amount of the glass phase is less than 5 mass %, it is possible to attain very high thermal conductivity in the glass-ceramics composite material obtained as a result of firing the mixture of such a glass phase and non-oxide system compound crystal phase. It is considered that this is because a large amount of crystalline phase which has thermal conductivity higher than that of an amorphous glass phase generates by firing the mixture of the glass phase with such a low flux composition rate and the non-oxide system compound crystal phase at a firing temperature appropriate to such a low flux composition rate. As a specific example of the crystal which constitutes such a crystalline phase, for example, the crystals of spinel system compounds such as gahnite ($ZnAl_2O_4$) and spinel ($MgAl_2O_4$), silicate compounds such as magnesium silicate, and aluminum silicate compounds such as mullite and cordierite, etc. can be exemplified.

Therefore, the ninth embodiment of the present invention is, the glass-ceramics composite material according to any one of said first to said eighth embodiments of the present invention, wherein:

the composition rate of the flux component which comprises at least one sort of substances chosen from the group of boron oxide ($B_2O_3$), lithium oxide ($Li_2O$), sodium oxide ($Na_2O$), and potassium oxide ($K_2O$) in said glass phase is less than 5 mass based on the total amount of said glass phase.

As mentioned above, in the glass-ceramics composite material according to the present embodiment, the composition rate of the flux component which comprises at least one sort of substances chosen from the group of boron oxide ($B_2O_3$), lithium oxide ($Li_2O$), sodium oxide ($Na_2O$), and potassium oxide ($K_2O$) in said glass phase is less than 5 mass % based on the total amount of said glass phase. Thereby, in the glass-ceramics composite material according to the present embodiment, the intrinsic thermal conductivity improvement effect by addition of non-oxide system compound crystal phase (filler particles) can be sufficiently demonstrated, and the thermal conductivity of the glass-ceramics composite material can be further raised, without the need for any special material (such as a rare earth component, etc.) etc.

In addition, in order to make it easy to fire with the non-oxide system compound crystal phase (filler particles) when the glass phase with a low flux composition rate as mentioned above, it is often desirable to fire the mixture of the glass phase and non-oxide system compound crystal phase as mentioned above in a temperature range (for example, 700° C. to 1150° C.) higher than the general temperature range (for example, 700° C. to 1050° C.). Concrete firing temperature can be properly determined depending on the composition of the glass phase and non-oxide system compound crystal phase, for example, by a preliminary experiment etc.

Moreover, also in the case where the glass phase which has a low flux composition rate as mentioned above is used, at least one sort of non-oxide system compound crystal phase chosen from the group of aluminum nitride (AlN), silicon carbide (SiC), and silicon nitride ($Si_3N_4$) can be used at the composition rate which is not less than 20 mass % and 60 mass % or less, as mentioned above. Namely, also in the present embodiment, any one sort of non-oxide system compound crystal phase chosen from the group of aluminum nitride (AlN), silicon carbide (SiC), and silicon nitride ($Si_3N_4$) may be blended solely, or two or more sorts of non-oxide system compound crystal phase may be blended in combination at any rate.

Especially, silicon carbide (SiC) has an effect which promotes and/or stabilizes the precipitation from the glass phase of crystal phase, such as spinel and cordierite. Therefore, it may be desirable to use it in combination with other filler particles, such as aluminum nitride (AlN) and silicon nitride ($Si_3N_4$). Moreover, for the purpose of promotion and/or stabilization of the precipitation of the crystal phase from the glass phase, oxide fillers, such as titanium oxide ($TiO_2$), zirconium oxide ($ZrO_2$), cordierite, and spinel ($MgAl_2O_4$), may be used in combination with the non-oxide compound filler.

Hereinafter, the composition and characteristic of the glass-ceramics composite materials according to some embodiments of the present invention, etc. will be explained in more detail. However, the explanation described below is aimed at just an exemplification, and the scope of the present invention should not be interpreted as to be limited to the following explanation.

EXAMPLE 1

(1) Preparation of Samples for Evaluation

The glass-ceramics composite materials which have various compositions listed in Table 1 were prepared as samples for evaluation (specimens). Broadly, the samples for evaluation, wherein the composition ratios of all the glass raw materials fall within the range desirable for a glass-ceramics composite material according to the present invention, were classified as Working Examples (E01 to E26), and the samples for evaluation, wherein the composition ratios of any of the constituent components deviates from the range desirable for a glass-ceramics composite material according to the present invention, were classified as Comparative Examples (C01 to C15).

More particularly, the glass phase was generated by first blending the raw materials of various constituent components which constitute the glass phase, melting the same at a high temperature and thereafter cooling the same rapidly. On this occasion, as for the Comparative Examples wherein the composition ratios of aluminum oxide ($Al_2O_3$), zinc oxide (ZnO), magnesium oxide (MgO), and silicon oxide ($SiO_2$) are superfluous (respectively, C12 to C15), it was difficult to be vitrified and could not produce a glass phase normally. Resulting glass phases were ground to powder, mixed with non-oxide system compound crystal phases (filler particles) in the compounding ratios shown in Table 1, and fired in nitrogen atmosphere at the temperature of 700 to 1050° C. Thus, various samples for evaluation were prepared. On this occasion, as for the Comparative Example wherein the composition rate of non-oxide system compound crystal phase (filler particles) is superfluous (C01), the mixture of the non-oxide system compound crystal phase (filler particles) and glass phase could not be sufficiently densified by firing.

(2) Measurement of Thermal Conductivity of Samples for Evaluation

For each of the various samples for evaluation (specimen) obtained as mentioned above, thermal conductivity was measured. As a measuring method of thermal conductivity, the "laser flash method" which is a typical method among unsteady methods was adopted. In addition, although explanation about the details of the "laser flash method" is omitted here since it is well-known by the person skilled in the art, the thermal conductivities listed in Table 1 were acquired by multiplying the thermal diffusivity measured by the "laser flash method" by the specific heat and density of the various samples for evaluation. The thermal conductivities of the various samples for evaluation thus acquired are listed in the following Table 1 along with the compositions of respective samples for evaluation.

TABLE 1

| | Glass Phase Composition [mass %] | | | | | | | | Composite Material Composition [mass %] | | | | Thermal Conductivity |
|---|---|---|---|---|---|---|---|---|---|---|---|---|---|
| | $Al_2O_3$ | MgO | ZnO | $SiO_2$ | $B_2O_3$ | $Li_2O$ | $Na_2O$ | $K_2O$ | Glass | AlN | SiC | $Si_3N_4$ | [W/m · ° C.] |
| E01 | 20 | 20 | 5  | 50 | 5  |    |   |   | 80 | 20 |    |    | 6 |
| E02 | 12 | 10 | 15 | 47 | 16 |    |   |   | 75 | 25 |    |    | 7 |
| E03 | 24 | 16 | 0  | 30 | 30 |    |   |   | 75 | 25 |    |    | 7 |
| E04 | 22 | 16 | 0  | 30 | 27 | 5  |   |   | 75 | 25 |    |    | 7 |
| E05 | 20 | 15 | 0  | 30 | 25 | 10 |   |   | 75 | 25 |    |    | 7 |
| E06 | 16 | 5  | 22 | 42 | 15 |    |   | 2 | 75 | 25 |    |    | 7 |
| E07 | 20 | 16 | 2  | 55 | 5  |    | 2 |   | 75 | 25 |    |    | 7 |
| E08 | 20 | 19 | 4  | 50 | 7  |    |   |   | 65 | 35 |    |    | 8 |
| E09 | 21 | 12 | 8  | 42 | 17 |    |   |   | 65 | 35 |    |    | 8 |
| E10 | 21 | 12 | 8  | 42 | 17 |    |   |   | 65 |    | 35 |    | 7 |
| E11 | 21 | 12 | 8  | 42 | 17 |    |   |   | 65 |    |    | 35 | 7 |
| E12 | 30 | 5  | 30 | 17 | 16 | 2  |   |   | 65 | 35 |    |    | 7 |
| E13 | 29 | 4  | 32 | 15 | 14 | 4  | 2 |   | 65 | 35 |    |    | 7 |
| E14 | 28 | 0  | 40 | 15 | 17 |    |   |   | 65 | 35 |    |    | 7 |
| E15 | 16 | 10 | 34 | 20 | 20 |    |   |   | 65 | 35 |    |    | 8 |
| E16 | 20 | 19 | 3  | 48 | 10 |    |   |   | 65 | 35 |    |    | 7 |
| E17 | 13 | 40 | 2  | 30 | 15 |    |   |   | 65 | 35 |    |    | 7 |

TABLE 1-continued

| | Glass Phase Composition [mass %] | | | | | | | | Composite Material Composition [mass %] | | | | Thermal Conductivity |
|---|---|---|---|---|---|---|---|---|---|---|---|---|---|
| | $Al_2O_3$ | MgO | ZnO | $SiO_2$ | $B_2O_3$ | $Li_2O$ | $Na_2O$ | $K_2O$ | Glass | AlN | SiC | $Si_3N_4$ | [W/m·°C.] |
| E18 | 12 | 13 | 0 | 60 | 15 | | | | 65 | 35 | | | 7 |
| E19 | 23 | 13 | 7 | 40 | 17 | | | | 60 | 40 | | | 10 |
| E20 | 33 | 14 | 3 | 33 | 15 | 2 | | | 60 | 40 | | | 10 |
| E21 | 33 | 14 | 3 | 33 | 15 | 2 | | | 60 | | 40 | | 10 |
| E22 | 33 | 14 | 3 | 33 | 15 | 2 | | | 60 | | | 40 | 9 |
| E23 | 32 | 14 | 3 | 34 | 17 | | | | 50 | 50 | | | 12 |
| E24 | 32 | 17 | 0 | 34 | 17 | | | | 45 | 55 | | | 11 |
| E25 | 32 | 14 | 3 | 34 | 17 | | | | 40 | 60 | | | 12 |
| E26 | 40 | 15 | 0 | 25 | 20 | | | | 40 | 60 | | | 12 |
| C01 | 32 | 14 | 3 | 34 | 17 | | | | 35 | 65 | | | 5 |
| C02 | 9 | 6 | 24 | 44 | 17 | | | | 80 | 20 | | | 4 |
| C03 | 9 | 6 | 24 | 44 | 17 | | | | 75 | 25 | | | 5 |
| C04 | 25 | 10 | 4 | 46 | 15 | | | | 65 | 35 | | | 5 |
| C05 | 9 | 6 | 24 | 44 | 17 | | | | 65 | 35 | | | 5 |
| C06 | 9 | 6 | 24 | 44 | 15 | 2 | | | 65 | 35 | | | 5 |
| C07 | 23 | 8 | 7 | 45 | 17 | | | | 60 | 40 | | | 8 |
| C08 | 23 | 8 | 7 | 45 | 17 | | | | 60 | | 40 | | 7 |
| C09 | 10 | 10 | 20 | 43 | 17 | | | | 50 | 50 | | | 8 |
| C10 | 10 | 10 | 20 | 43 | 17 | | | | 45 | 55 | | | 8 |
| C11 | 10 | 10 | 20 | 43 | 17 | | | | 40 | 60 | | | 10 |
| C12 | 42 | 12 | 2 | 27 | 17 | | | | | | | | |
| C13 | 20 | 2 | 45 | 16 | 17 | | | | | | | | |
| C14 | 20 | 45 | 2 | 16 | 17 | | | | | | | | |
| C15 | 12 | 0 | 8 | 70 | 10 | | | | | | | | |

(3) Evaluation of Samples for Evaluation

As shown in Table 1, from the comparison result among the samples for evaluation with same composition rate of non-oxide system compound crystal phase (filler particles), it has been confirmed that the thermal conductivity of the sample for evaluation wherein the composition rates of all the constituent components fall within the range desirable for a glass-ceramics composite material according to the present invention (Working Example) is not less than 20% larger than that of the sample for evaluation wherein the composition rate of either constituent component deviates from the range desirable for a glass-ceramics composite material according to the present invention (Comparative Example).

Moreover, in the Comparative Examples wherein the composition rates of magnesium oxide (MgO) and zinc oxide (ZnO) are both insufficient (C04, C07, and C08), even though the composition rate of aluminum oxide ($Al_2O_3$) corresponds to the above-mentioned suitable range, sufficiently high thermal conductivity could not be attained as compared with the Working Examples wherein the compositions are similar and magnesium oxide (MgO) or zinc oxide (ZnO) is blended at the suitable composition rate (E14 and E18). It is judged that the unintended reaction between the non-oxide system compound crystal phase (filler particles) and the glass phase as mentioned above could not be effectively suppressed and, as a result, the thermal conductivity improvement effect by addition of non-oxide system compound crystal phase (filler particles) could not be sufficiently demonstrated since the composition rates of magnesium oxide (MgO) and zinc oxide (ZnO) are both insufficient in the Comparative Examples (C04, C07, and C08).

Namely, in the glass-ceramics composite material according to the present invention, the decrease in the thermal conductivity improvement effect due to the unintended reaction between the non-oxide system compound crystal phase (filler particles) and the glass phase can be suppressed and the thermal conductivity of the glass-ceramics composite material can be raised, by blending at least either of magnesium oxide (MgO) component or zinc oxide (ZnO) component in a predetermined quantity and blending aluminum oxide ($Al_2O_3$) component in a predetermined quantity in the glass phase which constitutes the glass-ceramics composite material.

EXAMPLE 2

(1) Preparation of Samples for Evaluation

The glass-ceramics composite materials which have various compositions listed in Table 2 were prepared as samples for evaluation (specimens). Broadly, among various glass-ceramics composite materials wherein the composition ratios of a flux component is less than 5 mass % based on the total amount of the glass phase, the samples for evaluation, wherein the composition ratios of all the glass raw materials fall within the range desirable for a glass-ceramics composite material according to the present invention, were classified as Working Examples (E31 to E42), and the samples for evaluation, wherein the composition ratios of any of the constituent components deviates from the range desirable for a glass-ceramics composite material according to the present invention, were classified as Comparative Examples (C31 to C39).

More particularly, the glass phase was generated by first blending the raw materials of various constituent components which constitute the glass phase, melting the same at a high temperature and thereafter cooling the same rapidly. On this occasion, as for the Comparative Examples wherein the composition ratios of magnesium oxide (MgO), aluminum oxide ($Al_2O_3$), and silicon oxide ($SiO_2$) are superfluous (respectively, C35 and C36, C37, and C38), as well as the Comparative Example wherein the composition ratio of silicon oxide ($SiO_2$) is insufficient (C39), it was difficult to be vitrified and could not produce a glass phase normally. As for the Working Examples (E31 to E42) and Comparative Examples (C31 to C33) from which the glass phase could be obtained, the glass phases were ground to powder, mixed with non-oxide system compound crystal phases (filler particles) in the compounding ratios shown in Table 2, and fired in nitrogen atmosphere at the temperature of 700 to 1050° C. Thus, various samples for evaluation were prepared.

(2) Measurement of Thermal Conductivity of Samples for Evaluation

For each of the various samples for evaluation (specimen) obtained as mentioned above, thermal conductivity was measured. As a measuring method of thermal conductivity, similarly to Example 1, the "laser flash method" which is a typical method among unsteady methods was adopted. In addition, although explanation about the details of the "laser flash method" is omitted here since it is well-known by the person skilled in the art, the thermal conductivities listed in Table 2 were acquired by multiplying the thermal diffusivity measured by the "laser flash method" by the specific heat and density of the various samples for evaluation. The thermal conductivities of the various samples for evaluation thus acquired are listed in the following Table 2 along with the compositions of respective samples for evaluation.

More particularly, in the Comparative Example wherein the composition rate of non-oxide system compound crystal phase (filler particles) is superfluous (C31), sufficiently high thermal conductivity could not be attained as compared with the Working Examples wherein the compositions are similar and non-oxide system compound crystal phase (filler particles) is blended at the suitable composition rate (E35 to E37). It is judged that the mixture of the non-oxide system compound crystal phase (filler particles) and the glass phase could not sufficiently densified by firing and, as a result, the thermal conductivity improvement effect by addition of non-oxide system compound crystal phase (filler particles) could not be sufficiently demonstrated since the composition rate of non-oxide system compound crystal phase (filler particles) is superfluous in the Comparative Example (C31).

Moreover, in the Comparative Example wherein the composition rate of aluminum oxide ($Al_2O_3$) is insufficient (C32), even though the composition rates of magnesium oxide (MgO) and zinc oxide (ZnO) correspond to the above-mentioned suitable ranges, sufficiently high thermal conductivity

TABLE 2

| | Glass Phase Composition [mass %] | | | | | | | | Composite Material Composition [mass %] | | | | Thermal Conductivity |
|---|---|---|---|---|---|---|---|---|---|---|---|---|---|
| | $Al_2O_3$ | MgO | ZnO | $SiO_2$ | $B_2O_3$ | $Li_2O$ | $Na_2O$ | $K_2O$ | Glass | AlN | SiC | $Si_3N_4$ | [W/m · ° C.] |
| E31 | 27 | 12 | 4 | 55 | 2 | | | | 80 | 20 | | | 7 |
| E32 | 12 | 26 | 0 | 60 | 2 | | | | 75 | 25 | | | 8 |
| E33 | 30 | 25 | 0 | 41 | 4 | | | | 70 | 30 | | | 9 |
| E34 | 16 | 27 | 0 | 53 | 4 | | | | 65 | 35 | | | 9 |
| E35 | 25 | 25 | 0 | 50 | 0 | | | | 60 | 40 | | | 10 |
| E36 | 25 | 25 | 0 | 50 | 0 | | | | 50 | 50 | | | 12 |
| E37 | 25 | 25 | 0 | 50 | 0 | | | | 40 | 60 | | | 13 |
| E38 | 20 | 31 | 6 | 40 | 0 | | | 3 | 65 | 35 | | | 9 |
| E39 | 27 | 12 | 8 | 50 | 0 | 1 | | 2 | 65 | 35 | | | 9 |
| E40 | 27 | 12 | 8 | 50 | 0 | 1 | | 2 | 65 | | 35 | | 9 |
| E41 | 27 | 12 | 8 | 50 | 0 | 1 | | 2 | 65 | | | 35 | 8 |
| E42 | 25 | 6 | 30 | 35 | 3 | | | 1 | 65 | 35 | | | 8 |
| C31 | 25 | 25 | 0 | 50 | 17 | | | | 35 | 65 | | | 5 |
| C32 | 9 | 26 | 3 | 60 | 17 | | | | 75 | 25 | | | 5 |
| C33 | 27 | 10 | 6 | 54 | 17 | 1 | | 2 | 65 | 35 | | | 6 |
| C35 | 20 | 45 | 2 | 30 | 17 | | | | | | | | |
| C36 | 30 | 45 | 2 | 20 | 15 | | | | | | | | |
| C37 | 45 | 20 | 2 | 30 | 17 | | | | | | | | |
| C38 | 15 | 4 | 8 | 70 | 17 | | | | | | | | |
| C39 | 25 | 30 | 30 | 12 | 10 | | | | | | | | |

(3) Evaluation of Samples for Evaluation

As shown in Table 2, from the comparison result among the samples for evaluation with same composition rate of non-oxide system compound crystal phase (filler particles), in the present example wherein the composition ratios of a flux component in the glass phase is less than 5 mass % based on the total amount of the glass phase, it has been confirmed that the thermal conductivity of the sample for evaluation wherein the composition rates of all the constituent components fall within the range desirable for a glass-ceramics composite material according to the present invention (Working Example) is not less than 30% larger than that of the sample for evaluation wherein the composition rate of either constituent component deviates from the range desirable for a glass-ceramics composite material according to the present invention (Comparative Example), and that thermal conductivity can be raised more effectively as compared with the case where the composition rate of the flux component in a glass phase is in a higher range (not less than 5 mass %, and 35 mass % or less) (Example 1).

could not be attained as compared with the Working Example wherein the composition is similar and aluminum oxide ($Al_2O_3$) is blended at the suitable composition rate (E32). It is judged that the unintended reaction between the non-oxide system compound crystal phase (filler particles) and the glass phase as mentioned above could not be effectively suppressed and, as a result, the thermal conductivity improvement effect by addition of non-oxide system compound crystal phase (filler particles) could not be sufficiently demonstrated since the composition rate of aluminum oxide ($Al_2O_3$) is insufficient in the Comparative Example (C32).

Further, in the Comparative Example wherein the composition rates of magnesium oxide (MgO) and zinc oxide (ZnO) are both insufficient (C33), even though the composition rates of aluminum oxide ($Al_2O_3$) and silicon oxide ($SiO_2$) correspond to the above-mentioned suitable ranges, sufficiently high thermal conductivity could not be attained as compared with the Working Examples wherein the compositions are similar and magnesium oxide (MgO) or zinc oxide (ZnO) is blended at the suitable composition rate (E39 to E41). It is judged that the unintended reaction between the non-oxide system compound crystal phase (filler particles) and the glass phase as mentioned above could not be effectively suppressed and, as a result, the thermal conductivity improvement effect by addition of non-oxide system compound crystal phase (filler particles) could not be sufficiently demonstrated since the composition rates of magnesium oxide (MgO) and zinc oxide (ZnO) are both insufficient in the Comparative Example (C33).

Namely, it has been anew confirmed by the present example that, in the glass-ceramics composite material according to the present invention, the decrease in the thermal conductivity improvement effect due to the unintended reaction between the non-oxide system compound crystal phase (filler particles) and the glass phase can be suppressed and the thermal conductivity of the glass-ceramics composite material can be raised, by blending at least either of magnesium oxide (MgO) component or zinc oxide (ZnO) component in a predetermined quantity and blending aluminum oxide ($Al_2O_3$) component in a predetermined quantity in the glass phase which constitutes the glass-ceramics composite material. In addition, it has been confirmed by the present example that, the intrinsic thermal conductivity improvement effect by addition of non-oxide system compound crystal phase (filler particles) can be sufficiently demonstrated and the thermal conductivity of the glass-ceramics composite material can be further raised, by blending a flux component in a glass phase at a composition rate of less than 5 mass % based on the total amount of the glass phase.

Although some embodiments with certain configurations have been described for the purpose of explanation of the present invention, as mentioned above, it is not necessary to say that the scope of the present invention is not limited to these exemplary embodiments and modification can be properly added within the range of the matter described in the claims and specification.

The invention claimed is:

1. A glass-ceramics composite material obtained by firing:
   a glass phase which comprises aluminum oxide ($Al_2O_3$), at least either of magnesium oxide (MgO) or zinc oxide (ZnO), silicon oxide ($SiO_2$), and boron oxide ($B_2O_3$) as main components, and
   at least one non-oxide system compound crystal phase selected from the group consisting of aluminum nitride (AlN), silicon carbide (SiC), and silicon nitride ($Si_3N_4$),
   wherein, based on the total amount of said glass phase,
      the composition rate of aluminum oxide ($Al_2O_3$) is not less than 16 mass % and is 40 mass % or less,
      the composition rate of magnesium oxide (MgO) is not less than 13 mass % and 31 mass % or less, or the composition rate of zinc oxide (ZnO) is not less than 15 mass % and 40 mass % or less, and
      the composition rate of silicon oxide ($SiO_2$) is not less than 15 mass % and is 60 mass % or less,
   wherein, based on the amount of sum total of said glass phase and said non-oxide system compound crystal phase,
      the composition rate of said non-oxide system compound crystal phase is more than 29 mass % and 60 mass % or less when said non-oxide system compound crystal phase comprises aluminum nitride (AlN) or silicon carbide (SiC), and the composition rate of said non-oxide system compound crystal phase is not less than 35 mass % and is 60 mass % or less when said non-oxide system compound crystal phase is silicon nitride ($Si_3N_4$), and
   wherein the non-oxide system compound crystal phase comprises particles.

2. The glass-ceramics composite material according to claim 1, wherein:
   the composition rate of aluminum oxide ($Al_2O_3$) based on the total amount of said glass phase is not less than 20 mass % and 40 mass % or less.

3. The glass-ceramics composite material according to claim 1, wherein:
   the composition rate of magnesium oxide (MgO) based on the total amount of said glass phase is not less than 15 mass % and 31 mass % or less.

4. The glass-ceramics composite material according to claim 1, wherein:
   the composition rate of silicon oxide ($SiO_2$) based on the total amount of said glass phase is not less than 20 mass % and 60 mass % or less.

5. The glass-ceramics composite material according to claim 1, wherein:
   the composition rate of boron oxide ($B_2O_3$) as a flux component in said glass phase is less than 5 mass % based on the total amount of said glass phase.

6. The glass-ceramics composite material according to claim 2, wherein:
   the composition rate of boron oxide ($B_2O_3$) as a flux component in said glass phase is less than 5 mass % based on the total amount of said glass phase.

7. The glass-ceramics composite material according to claim 3, wherein:
   the composition rate of boron oxide ($B_2O_3$) as a flux component in said glass phase is less than 5 mass % based on the total amount of said glass phase.

8. The glass-ceramics composite material according to claim 4, wherein:
   the composition rate of boron oxide ($B_2O_3$) as a flux component in said glass phase is less than 5 mass % based on the total amount of said glass phase.

9. The glass-ceramics composite material according to claim 1, wherein:
   said glass phase comprises, as flux components, at least one substance selected from the group consisting of lithium oxide ($Li_2O$), sodium oxide ($Na_2O$) and potassium oxide ($K_2O$), in addition to boron oxide ($B_2O_3$), and
   the total composition rate of said flux components in said glass phase is less than 5 mass % based on the total amount of said glass phase.

10. The glass-ceramics composite material according to claim 2, wherein:
    said glass phase comprises, as flux components, at least one substance selected from the group consisting of lithium oxide ($Li_2O$), sodium oxide ($Na_2O$) and potassium oxide ($K_2O$), in addition to boron oxide ($B_2O_3$), and
    the total composition rate of said flux components in said glass phase is less than 5 mass % based on the total amount of said glass phase.

11. The glass-ceramics composite material according to claim 3, wherein:
    said glass phase comprises, as flux components, at least one substance selected from the group consisting of lithium oxide ($Li_2O$), sodium oxide ($Na_2O$) and potassium oxide ($K_2O$), in addition to boron oxide ($B_2O_3$), and
    the total composition rate of said flux components in said glass phase is less than 5 mass % based on the total amount of said glass phase.

12. The glass-ceramics composite material according to claim 4, wherein:

said glass phase comprises, as flux components, at least one substance selected from the group consisting of lithium oxide ($Li_2O$), sodium oxide ($Na_2O$) and potassium oxide ($K_2O$), in addition to boron oxide ($B_2O_3$), and the total composition rate of said flux components in said glass phase is less than 5 mass % based on the total amount of said glass phase.

\* \* \* \* \*